(12) United States Patent
Lee et al.

(10) Patent No.: US 6,927,480 B2
(45) Date of Patent: Aug. 9, 2005

(54) MULTI-CHIP PACKAGE WITH ELECTRICAL INTERCONNECTION

(75) Inventors: Bau-Nan Lee, Pingtung (TW); Cheng-Fen Chen, Kaohsiung (TW); Chih-Wei Tsai, Tainan (TW); Chih-Pin Hung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/838,351

(22) Filed: May 5, 2004

(65) Prior Publication Data

US 2004/0222503 A1 Nov. 11, 2004

(30) Foreign Application Priority Data

May 8, 2003 (TW) ........................................ 92112600 A

(51) Int. Cl.[7] ............................................. H01L 23/495
(52) U.S. Cl. ....................... 257/666; 257/782; 257/784; 257/E23.031; 257/E23.06; 257/E23.56
(58) Field of Search ................................. 257/666, 782, 257/784, E23.031, E23.56, E23.06

(56) References Cited

U.S. PATENT DOCUMENTS 5,361,970 A * 11/1994 Kasai et al. ............. 228/180.5
5,496,967 A * 3/1996 Hashimoto et al. ........ 174/52.4
6,759,753 B2 * 7/2004 Chao ........................... 257/787

FOREIGN PATENT DOCUMENTS

| CN | TW448518 | 8/2001 | |
| JP | 61-237459 | * 10/1986 | ........... H01L/21/60 |
| JP | 2-294061 | * 12/1990 | ................. 257/724 |
| JP | 4-329661 | * 11/1992 | ........... H01L/21/60 |

* cited by examiner

*Primary Examiner*—Jasmine Clark
(74) *Attorney, Agent, or Firm*—Troxell Law Office, PLLC

(57) ABSTRACT

A multi-chip package with electrical interconnection comprises a leadframe, at least a relay conductor, at least a first chip, at least a second chip, a plurality of bonding wires and a molding compound. A dielectric carrier is attached to the leadframe for fixing the relay conductor. The relay conductor has a top surface for interconnection of the bonding wires and a bottom surface attached to the dielectric carrier to electrically isolated from the leadframe. The bonding wires electrically connect the bonding pads of the first chip and second chip to the common lead of the leadframe through the relay conductor so as to achieve electrical interconnection of the plurality of chips and the leadframe inside the molding compound with lower cost.

20 Claims, 3 Drawing Sheets

MULTI-CHIP PACKAGE WITH ELECTRICAL INTERCONNECTION

FIELD OF THE INVENTION

The present invention generally relates to a multi-chip package, particularly to a multi-chip package with electrical interconnection by using a relay conductor.

BACKGROUND OF THE INVENTION

A conventional multi-chip package includes a plurality of chips which are electrically connected to a leadframe and sealed inside a molding compound. The leads of leadframe cannot perform as the redistributed traces in the substrate that can be flexibly routed. When the plurality of chips share the same power source, ground plane or signal paths, it is practically not easy to connect the chips to a common lead through bonding wires so that the only way is to create extra traces routing in the outer printed circuit board to connect the common leads after surface-mounting the package.

R.O.C. Taiwan Patent No. 448,518 entitled "multi-chip package with leadframe" discloses a multi-chip package utilizing a leadframe. An internal substrate, such as a printed wiring board, is disposed inside the molding compound as an electrical interconnection between the leadframe and the plurality of chips. Therefore, electrical interconnection for common leads can be achieved without the need of redesigning the bonding pads of the chips. However, the internal substrate is attached to the leads of the leadframe and sealed inside the molding compound, the multi-chip package becomes thicker and the package cost becomes higher.

SUMMARY

The main object of the present invention is to provide a multi-chip package with electrical interconnection, a dielectric carrier is provided to fix at least a relay conductor of a leadframe so that the relay conductor is placed on the dielectric carrier at a proper location and is electrically isolated from the leadframe as an interconnecting island of the plurality of bonding wires from the chips. Further, the relay conductor is electrically connected to the common lead of the leadframe by wire bonding. Electrical interconnection for common leads can be achieved, therefore, it is not necessary to place a conventional internal substrate inside the molding compound.

The secondary object of the present invention is to provide a multi-chip package with electrical interconnection. A relay conductor is placed on a dielectric carrier or in an opening of a leadframe to be electrically isolated from the leadframe for interconnecting a plurality of chips through bonding wires without redesigning and changing the original locations of bonding pads of the chips. Thus the length of the bonding wires will be shortened and the potential risk of wire sweep during molding will be reduced.

According to the present invention, the multi-chip package comprises a leadframe, at least a relay conductor, at least a first chip, at least a second chip, a plurality of bonding wires and a molding compound. The leadframe has a plurality of leads including at least a common lead. A dielectric carrier is attached to the leadframe, such as a chip pad of the leadframe. The relay conductor has a top surface and a bottom surface, the bottom surface of the relay conductor is attached to the dielectric carrier which makes the relay conductor is electrically isolated from the leadframe, and the top surface of the relay conductor is used for wireNbonding connection. The first chip and the second chip are disposed on the leadframe or on the dielectric carrier and each has an active surface and a back surface respectively. A plurality of first pads are disposed on the active surface of the first chip, and a plurality of second pads are disposed on the active surface of the second chip respectively. The bonding wires electrically connect the first chip to the leads and the second chip to the leads. The bonding wires include a first bonding wire, a second bonding wire and a third bonding wire, wherein the first bonding wire connects one of the first pads of the first chip to the top surface of the relay conductor, the second bonding wire connects one of the second pads of the second chip to the top surface of the relay conductor, and the third bonding wire connects the top surface of the relay conductor to the common lead. Finally, the first chip, the second chip, the bonding wires, and the relay conductor are encapsulated by the molding compound.

DETAILED DESCRIPTION OF THE PRESENT INVENTION

Figure 1:
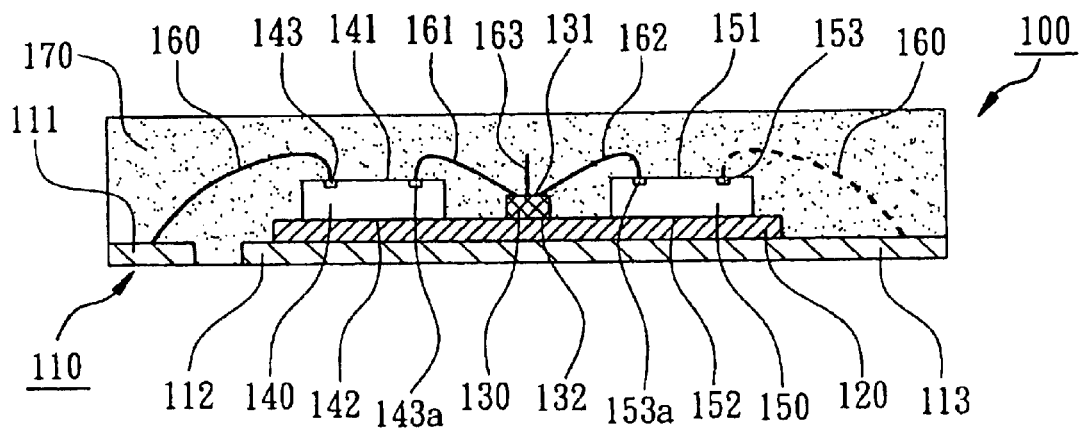
FIG. 1 is a cross-sectional view of a multi-chip package with electrical interconnection in accordance with the first embodiment of the present invention.

Referring to the drawings attached, the present invention will be described by means of the embodiments below.

Figure 2:
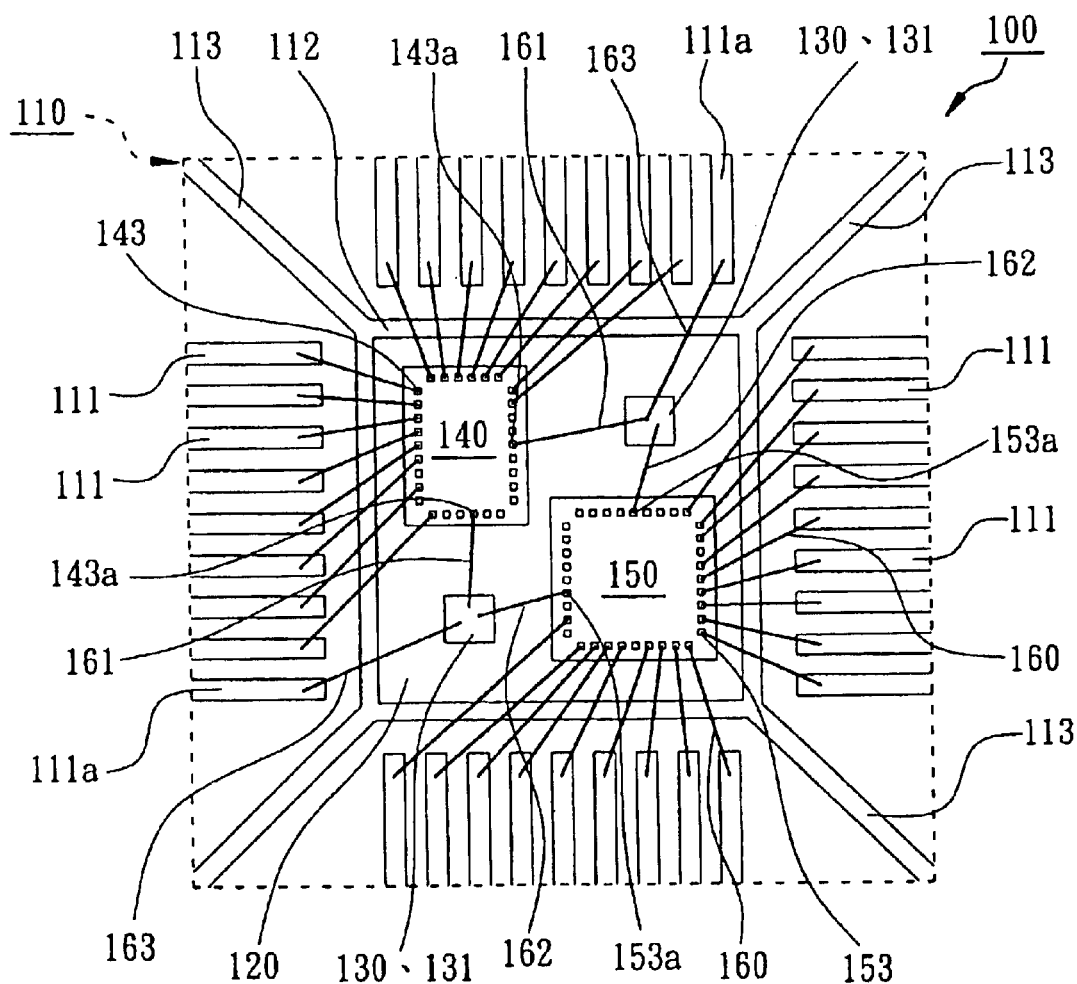
FIG. 2 is a top view of the multi-chip package in accordance with the first embodiment of the present invention.

In the first embodiment of the present invention, FIG. 1 is a cross-sectional view of a multi-chip package 100 with electrical interconnection, and FIG. 2 is a top view of the multi-chip package 100.

Referring to FIG. 1 and FIG. 2, the multi-chip package 100 comprises a leadframe 110, a dielectric carrier 120, at least a relay conductor 130, at least a first chip 140, at least a second chip 150 and a plurality of bonding wires 160. The bonding wires 160 include at least a first bonding wire 161, at least a second bonding wire 162 and at least a third bonding wire 163.

The leadframe 110 includes a plurality of leads 111 and a chip pad 112. In this embodiment, the leadframe 110 is a leadless leadframe such as quad flat non-leaded (QFN) leadframe or SON leadframe. As showed in FIG. 2, the leads 111 include at least a common lead 111a for simultaneously electrical connection for the first chip 140 and the second chip 150, such as sharing the power source, the ground plane or signal paths. A plurality of tie bars 113 connect the corners of the chip pad 112 to the leadframe. The dielectric carrier 120 is attached to the chip pad 112 of the leadframe 110 for fixing the relay conductor 130. In this embodiment, the dielectric carrier 120 is selected from a group of PI tape, BT resin and other dielectric materials, is attached to the upper surface of the chip pad 112 so as to electrically isolate the relay conductor 130 from the leadframe 110.

The relay conductor 130 has a top surface 131 and a bottom surface 132. The top surface 131 is used for connecting the first bonding wire 161, the second bonding wire 162 and the third bonding wire 163. The bottom surface 132 is attached to the dielectric carrier 120. The relay conductor 130 can be a metal island composed of iron or copper alloy.

In this embodiment, the first chip 140 is disposed on the dielectric carrier 120, and has an active surface 141 and an opposing back surface 142. The first chip, 140 has a plurality of first pads 143 on the active surface 141. At least one of the first pads 143 is a first common pad 143a. The second chip 150 is disposed on the dielectric carrier 120, and has an active surface 151 and an opposing back surface 152. The second chip 150 has a plurality of second pads 153 on the active surface 151. At least one of the second pads 153 is a second common pad 153a. The common lead 111a is shared with the first common pad 143a of the first chip 140 and the second common pad 153a of the second chip 150 via the relay conductor 130.

In the multi-chip package 100, the plurality of bonding wires 160 are used to electrically connect the first chip 140 and the second chip 150 to the leads 111 of the leadframe 110. The bonding wires 160 include at least a first bonding wire 161, a second bonding wire 162 and a third bonding wire 163. The first bonding wire 161 connects the first common pad 143a of the first chip 140 to the top surface 131 of the relay conductor 130. The second bonding wire 162 connects the electrical community second pad 153a of the second chip 150 to the top surface 131 of the relay conductor 130. The third bonding wire 163 connects the top surface 131 of the relay conductor 130 to the common lead 111a of the leadframe 110. Preferably, the first bonding wire 161, the second bonding wire 162, and the third bonding wire 163 are arranged in "Y" shape on the relay conductor 130. The first bonding wire 161 and the third bonding wire 163 can be integrated to be a single bonding wire having a knot on the relay conductor 130. By means of adjusting the location of the relay conductor 130, a flexible wire bonding path for electrical connection is provided to avoid interlacing the first, the second, the third bonding wire 161,162,163 and other bonding wires 160. In this embodiment, the molding compound 170 encapsulates the first chip 140, the second chip 150, the bonding wires 160, 161, 162, 163, the dielectric carrier 120 and the relay conductor 130. Moreover, the leads 111 have a plurality of bottom surfaces exposed, out of the molding compound 170 as outer connections of a leadless multi-chip package.

Therefore, in the foregoing multi-chip package 100, the relay conductor 130 is used as an interconnection island of bonding wires 161,162,163 to complete the electrical connections from the chips to the common leads 111a. The relay conductor 130 can be located at any proper place on the dielectric carrier 120 and electrically isolated from the leadframe 110, it is not necessary to attach an internal substrate on the chip pad or to create extra redistributed traces on the chips. Accordingly, the multi-chip package 100 of the present invention has the advantage of replacing the conventional internal substrate inside a molding compound and of achieving a common electrical interconnection without altering the locations of the pads 143, 143a, 153, 153a of original chips 140, 150. The risk of wire sweep during molding can be greatly reduced due to shorter bonding wires.

Figure 3:
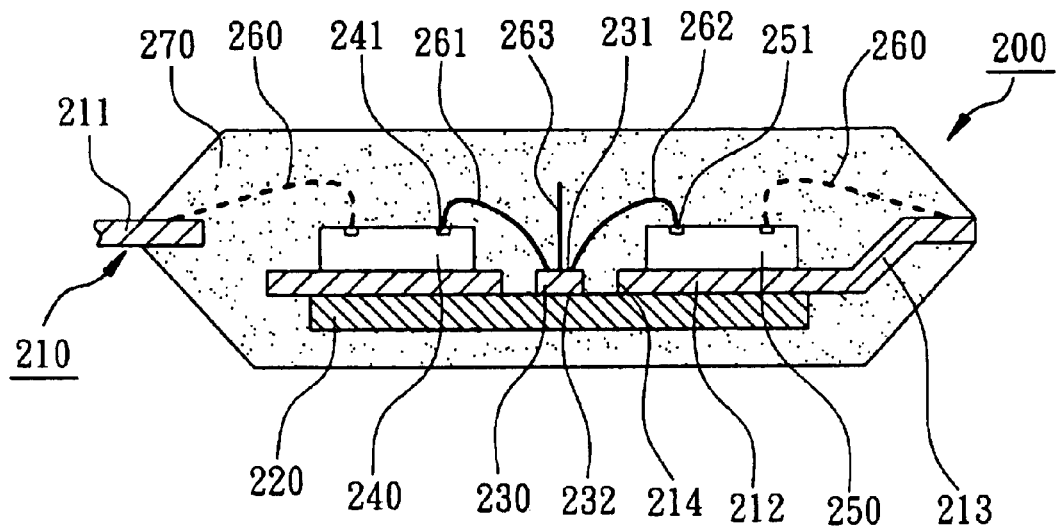
FIG. 3 is a cross-sectional view of a multi-chip package with electrical interconnection in accordance with the second embodiment of the present invention.

According to the second embodiment of the present invention, the type of the leadframe and the relative position of the dielectric carrier and the chip pad of the leadframe are not particularly limited to use. Referring to FIG. 3, a multi-chip package 200 with electrical interconnection comprises a leadframe 210, a dielectric carrier 220, at least a relay conductor 230, at least a first chip 240, at least a second chip 250, a molding compound 270 and a plurality of bonding wires 260. The leadframe 210 includes a plurality of leads 211, a chip pad 212 and a plurality of tie bars 213 connecting the chip pad 212. The leads 211 include at least a common lead (not showed in the drawing). The dielectric carrier 220 is attached to the bottom surface of the chip pad 212. The chip pad 212 has at least an opening 214, and the relay conductor 230 is formed in the opening 214 by etching the chip pad 212. The dielectric carrier 220 is also attached to the bottom surface 232 of the relay conductor 230 so that the relay conductor 230 is electrically isolated from the leadframe 210. The bonding wires 260 include at least a first bonding wire 261, a second bonding wire 262 and a third bonding wire 263, which are connected to the top surface 231 of the relay conductor 230. In this embodiment, the relay conductor 230 is formed from a part of the chip pad 212 in the opening 214 by means of etching or routing. The relay conductor 230 has the same thickness as the leadframe 210 for easily handling and storage. The first chip 240 and the second chip 250 are attached to the top surface of the chip pad 210, and each has at least a common pad 241 and 251 respectively. The first bonding wire 261 connects the first common pad 241 of the first chip 240 to the top surface 231 of the relay conductor 230, the second bonding wire 262 connects the second common pad 251 of the second chip 250 to the top surface 231 of the relay conductor 230, and the third bonding wire 263 connects the top surface 231 of the relay conductor 230 to the common lead (not showed in the drawings) of the leadframe 210. The other bonding wires 260 connect the bonding pads of the first chip 240 and the second chip 250 to the leads 211 of the leadframe 210 directly. Furthermore, the first chip 240, the second chip 250, the chip pad 210, the dielectric carrier 220, the relay conductor 230 and the bonding wires 260, 261, 262, 263 are sealed by the molding compound 270. The conventional internal substrate for MCP is no longer needed to achieve the electrical interconnection between the chips and the leads inside the molding compound 270. Moreover, in this embodiment, one end of the leads 211 are extended from the sides of the molding compound 270 to be the outer leads for SMT.

Figure 4:
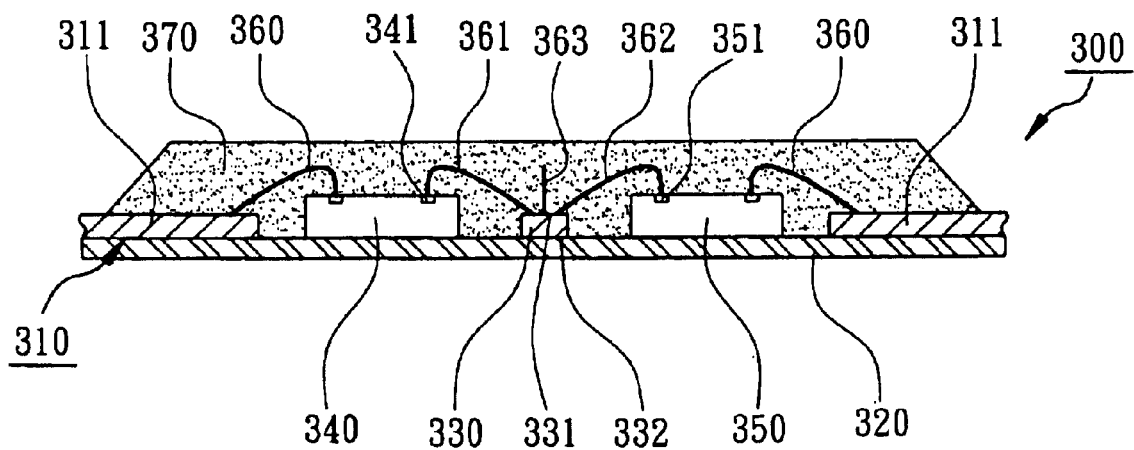
FIG. 4 is a cross-sectional view of a multi-chip package with electrical interconnection after molding in accordance with the third embodiment of the present invention.
Figure 5:
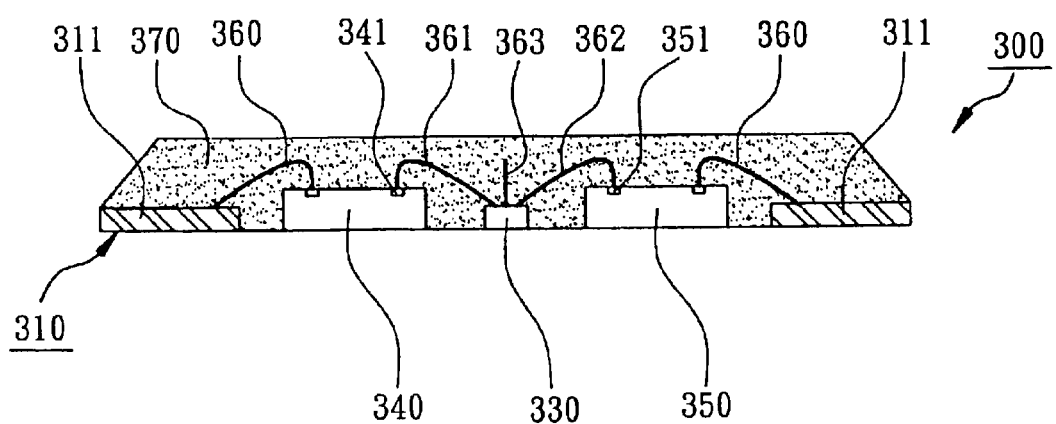
FIG. 5 is a cross-sectional view of the multi-chip package after removing the dielectric carrier in accordance with the third embodiment of the present invention.

In the third embodiment of the present invention, the chip pad and the outer leads are not particularly limited to use in this invention. Referring to FIGS. 4 and 5, a multi-chip package 300 with electrical interconnection includes a leadframe 310, at least a relay conductor 330, at least a first chip 340, at least a second chip 350, a plurality of bonding wires 360, a molding compound 370. The leadframe 310 includes a plurality of leads 311 but without a chip pad. A dielectric carrier 320 is attached to the bottom surface of the leads 311 during the packaging process, as showed in FIG. 4. In this embodiment, the dielectric carrier 320 is used as a QFN sacrificial adhesive tape. The bottom surface 332 of the relay conductor 330, the back surfaces of the first chip 340 and the second chip 350 are attached to the top surface of the dielectric carrier 320. The first chip 340 and the second chip 350 have at least one common pad 341 and 351 respectively. The bonding wires 360 include at least a first bonding wire 361, a second bonding wire 362, and a third bonding wire 363. The first bonding wire 361 connects the common pad 341 of the first chip 340 to the top surface 331 of the relay conductor 330. The second bonding wire 362 connects the common pad 351 of the second chip 350 to the top surface 331 of the relay conductor 330. The third bonding wire 363 connects to the common lead (not showed in the drawing) of the leadframe 310 to the top surface 331 of the relay conductor 330. Moreover, the first chip 340, the second chip 350, the dielectric carrier 320, the relay conductor 330 and the bonding wires 360, 361, 362, 363 are encapsulated by the molding compound 370. The dielectric carrier 320 can be removed after the formation of the molding compound 370. The back surfaces of the first chip 340 and the second chip 350, the bottom surface 332 of the relay conductor 330 and the bottom surfaces of the leads 311 are exposed out of the molding compound 370 to form a QFN multi-chip package which has a good electrical interconnection with lower cost. Moreover, heat dissipation will be another advantage for the multi-chip package 300 with electrical interconnection.

The above description of embodiments of this invention is intended to be illustrated and not limited. Other embodiments of this invention will be obvious to those skilled in the art in view of the above disclosure.

What is claimed is:

1. A multi-chip package with electrical interconnection comprising:
   a leadframe having a plurality of leads, the leads including a common lead;
   a dielectric carrier attached to the leadframe;
   a relay conductor having a top surface and a bottom surface, the bottom surface of the relay conductor being attached to the dielectric carrier to make the relay conductor be electrically isolated from the leadframe, the top surface of the relay conductor being formed for wire-bonding connection;
   a first chip disposed on the dielectric carrier, wherein the first chip has a back surface, an active surface, and a first pad disposed on the active surface of the first chip;
   a second chip disposed on the dielectric carrier, wherein the second chip has a back surface, an active surface and a second pad disposed on the active surface of the second chip;
   a first bonding wire connecting the first pad of the first chip to the top surface of the relay conductor;
   a second bonding wire connecting the second pad of the second chip to the top surface of the relay conductor;
   a third bonding wire connecting the top surface of the relay conductor to the common lead; and
   a molding compound sealing the first chip, the second chip, the relay conductor, the first bonding wire, the second bonding wire and the third bonding wire.

2. The package in accordance with the claim 1, wherein the leadframe includes a chip pad for attaching the dielectric carrier.

3. The package in accordance with the claim 2, wherein the dielectric carrier is attached to the top surface of the chip pad.

4. The package in accordance with the claim 1, wherein the dielectric carrier is attached to the leads.

5. The package in accordance with the claim 1, wherein the leads have a plurality of bottom surfaces exposed out of the molding compound.

6. The package in accordance with the claim 1, wherein the first bonding wire and the third bonding are integrated to be a single bonding wire.

7. A multi-chip package with electrical interconnection comprising:
   a leadframe having a plurality of leads and a chip pad, the leads including a common lead;
   a dielectric carrier attached to the chip pad;
   a relay conductor having a top surface and a bottom surface, the bottom surface of the relay conductor being attached to the dielectric carrier to make the relay conductor be electrically isolated from the chip pad, the top surface of the relay conductor being formed for wire-bonding connection;
   a first chip disposed on the chip pad, wherein the first chip has a back surface, an active surface, and a first pad disposed on the active surface of the first chip;
   at least a second chip disposed on the chip pad, wherein the second chip has a back surface, an active surface and a second pad disposed on the active surface of the second chip;
   a first bonding wire connecting the first pad of the first chip to the top surface of the relay conductor;
   a second bonding wire connecting the second pad of the second chip to the top surface of the relay conductor;
   a third bonding wire connecting the top surface of the relay conductor to the common lead; and
   a molding compound encapsulating the first chip, the second chip, the relay conductor, the first bonding wire, the second bonding wire and the third bonding wire.

8. The package in accordance with the claim 7, wherein the chip pad has an opening, the relay conductor is formed in the opening.

9. The package in accordance with the claim 7, wherein the dielectric carrier is attached to the bottom surface of the chip pad.

10. The package in accordance with the claim 7, wherein the leads have bottom surfaces exposed out of the molding compound.

11. The package in accordance with the claim 7, wherein the first bonding wire and the third bonding are integrated to be a single bonding wire.

12. A multi-chip package with electrical interconnection comprising:
    a leadframe having a lead;
    a relay conductor having a top surface and a bottom surface, the top surface of the relay conductor being formed for wireNbonding connection;
    a first chip having a back surface, an active surface, and a first pad disposed on the active surface of the first chip;
    a first bonding wire connecting the first pad of the first chip to the top surface of the relay conductor;
    a second bonding wire connecting the top surface of the relay conductor to the lead; and
    a molding compound encapsulating the first chip, the relay conductor, the first bonding wire and the second bonding wire.

13. The package in accordance with the claim 12, further comprising a second chip having a back surface, an active surface and a second pad disposed on the active surface of the second chip.

14. The package in accordance with the claim 13, further comprising a third bonding wire connecting the second pad of the second chip to the top surface of the relay conductor.

15. The package in accordance with the claim 12, wherein the back surface of the first chip is exposed out of the molding compound.

16. The package in accordance with the claim 15, wherein the bottom surface of the relay conductor is exposed out of the molding compound.

17. The package in accordance with the claim 12, wherein the lead has a bottom surface exposed out of the molding compound.

18. The package in accordance with the claim 12, wherein the first bonding wire and the second bonding are integrated to be a single bonding wire.

19. The package in accordance with the claim 12, further comprising a dielectric carrier, the bottom surface of the relay conductor being attached to the dielectric carrier.

20. The package in accordance with the claim 19, wherein the dielectric carrier is attached to the leadframe.

* * * * *